US011456734B2

(12) United States Patent
Chen

(10) Patent No.: US 11,456,734 B2
(45) Date of Patent: Sep. 27, 2022

(54) COMPARATOR

(71) Applicant: CHANGXIN MEMORY TECHNOLOGIES, INC., Anhui (CN)

(72) Inventor: Xiaofei Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/445,594

(22) Filed: Aug. 21, 2021

(65) Prior Publication Data

US 2022/0045669 A1 Feb. 10, 2022

Related U.S. Application Data

(63) Continuation of application No. PCT/CN2021/076216, filed on Feb. 9, 2021.

(30) Foreign Application Priority Data

Aug. 10, 2020 (CN) .......................... 202010794568.0

(51) Int. Cl.
*H03K 5/24* (2006.01)

(52) U.S. Cl.
CPC ........... *H03K 5/249* (2013.01); *H03K 5/2481* (2013.01)

(58) Field of Classification Search
CPC .... H03K 5/2481; H03K 5/249; H03K 5/2418; H04L 25/0272; H03F 3/45183
USPC .......................................................... 327/65
See application file for complete search history.

(56) References Cited

U.S. PATENT DOCUMENTS

| 7,453,294 | B1* | 11/2008 | Wang ..................... | H03K 3/012 |
| | | | | 327/212 |
| 2009/0108880 | A1* | 4/2009 | Soltanian .............. | H03F 3/4521 |
| | | | | 327/52 |
| 2014/0062621 | A1* | 3/2014 | Dai ....................... | H03M 1/183 |
| | | | | 333/216 |
| 2014/0132437 | A1* | 5/2014 | Danjo .................. | H03K 3/0233 |
| | | | | 327/214 |
| 2015/0015307 | A1* | 1/2015 | Shu ..................... | H03F 3/45071 |
| | | | | 327/52 |

(Continued)

FOREIGN PATENT DOCUMENTS

| CN | 101562441 A | 10/2009 |
| CN | 105680834 A | 6/2016 |

(Continued)

OTHER PUBLICATIONS

International Search Report in Application No. PCT/CN2021/076216, dated Apr. 30, 2021.

*Primary Examiner* — Quan Tra
*Assistant Examiner* — Ahn-Quan Tra
(74) *Attorney, Agent, or Firm* — Syncoda LLC; Feng Ma

(57) ABSTRACT

A comparator includes: a first stage circuit, configured to receive a voltage signal to be compared and a reference voltage signal Vref, and to generate and output a first amplifying signal and a second amplifying signal based on the voltage signal to be compared and the reference voltage signal Vref; a second stage circuit, connected with the first stage circuit, configured to generate and latch a first output signal and a second output signal based on the first amplifying signal and the second amplifying signal; wherein the first stage circuit and/or the second stage circuit include(s) a first pair of cross-coupled transistors.

14 Claims, 7 Drawing Sheets

(56) References Cited

U.S. PATENT DOCUMENTS

2016/0087607 A1    3/2016  Rajaee et al.
2020/0075064 A1*   3/2020  Kenyon ................ G11C 7/065

FOREIGN PATENT DOCUMENTS

CN    106374929 A     2/2017
KR    101733676 B1 *  5/2017    ......... H03F 3/45183

* cited by examiner

COMPARATOR

CROSS-REFERENCE TO RELATED APPLICATIONS

This is a continuation of International Patent Application No.: PCT/CN2021/076216 filed on Feb. 9, 2021, which claims priority to Chinese Patent Application No. 202010794568.0 filed on Aug. 10, 2020. The disclosures of these applications are hereby incorporated by reference in their entirety.

BACKGROUND

Recently, a great increase in demand has been found in mobile devices, such as mobile phones, tablets, various wearable accessories, or the like, which greatly enriches our daily work and life.

SUMMARY

Embodiments of the present application relate to the field of integrated circuit technologies, and more specifically to a comparator.

A comparator according to some embodiments of the present disclosure can solve the problems of a high working voltage and high power consumption of a conventional comparator.

A comparator according to some embodiments of the present disclosure includes:

a first stage circuit, configured to receive a voltage signal to be compared and a reference voltage signal, and to generate and output a first amplifying signal and a second amplifying signal based on the voltage signal to be compared and the reference voltage signal;

a second stage circuit, connected with the first stage circuit and configured to generate and latch a first output signal and a second output signal based on the first amplifying signal and the second amplifying signal;

wherein at least one of the first stage circuit and the second stage circuit comprises a first pair of cross-coupled transistors.

Details of one or more embodiments of the present disclosure are set forth in the following accompanying drawings and descriptions. Other features, objectives and advantages of the present disclosure become obvious with reference to the specification, the accompanying drawings, and the claims.

BRIEF DESCRIPTION OF THE DRAWINGS

In order to better describe and illustrate embodiments of the present application, reference may be made to one or more accompanying drawings. Additional details or examples used to describe the accompanying drawings should not be considered as limitations on the scope of any of the invention-creations, the embodiments described hereinafter, and the preferred embodiments of the present application.

DETAILED DESCRIPTION

Figure 1:
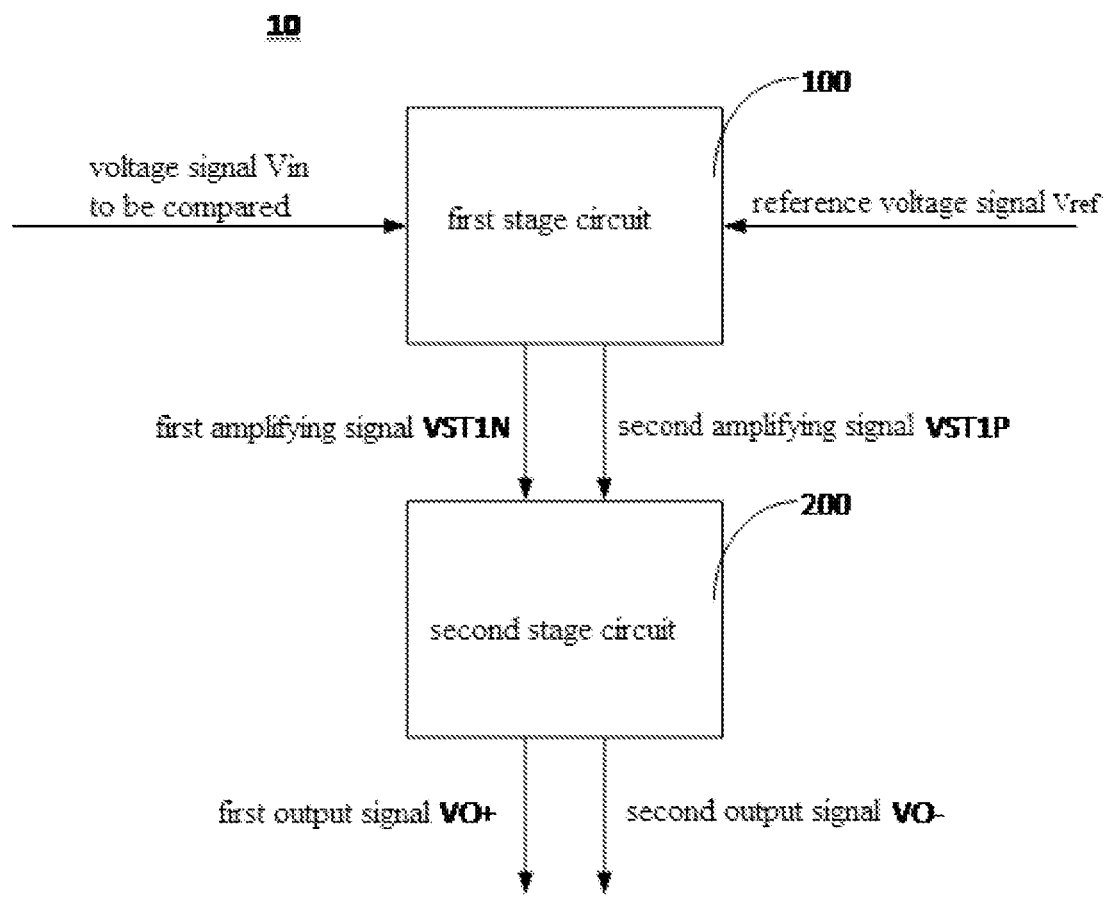
FIG. 1 is a schematic structural diagram of a comparator according to an embodiment.

For easy understanding of the present disclosure, a more comprehensive description of the present disclosure will be given below with reference to the relevant accompanying drawings. Preferred embodiments of the present disclosure are given in the drawings. However, the present disclosure may be implemented in many different forms and is not limited to the embodiments described herein. Rather, these embodiments are provided to make the contents disclosed in the present disclosure more thorough and comprehensive.

Unless defined otherwise, all technical and scientific terms used herein have the same meanings as are commonly understood by those skilled in the art. The terms used herein in the specification of the present disclosure are for the purpose of describing specific embodiments only but not intended to limit the present disclosure. The term "and/or" used herein includes any and all combinations of one or more related listed items.

However, due to limited battery life, a higher requirement is presented for power consumption of each component of the mobile device, in which a Dynamic Random-Access Memory (DRAM) is an essential component. Therefore, a lower working voltage and lower power consumption are urgent to realize in the DRAM. A comparator is an important device for implementing data read/write of the DRAM, and the working voltage and the power consumption of a conventional comparator cannot meet current usage requirements.

FIG. 1 is a schematic structural diagram of a comparator 10 according to an embodiment. Referring to FIG. 1, in this embodiment, the comparator 10 includes a first stage circuit 100 and a second stage circuit 200.

The first stage circuit 100 is configured to receive a voltage signal Vin to be compared and a reference voltage signal Vref, and to generate and output a first amplifying signal VST1N and a second amplifying signal VST1P based on the voltage signal Vin to be compared and the reference voltage signal Vref. The first stage circuit 100 is configured to receive two input voltage signals, namely the voltage signal Vin to be compared and the reference voltage signal Vref. The first stage circuit 100 generates a differential current based on the input signals, the differential current is configured to charge one output terminal of the first stage circuit 100 to a first voltage to serve as the first amplifying signal VST1N, and charge the other output terminal of the first stage circuit 100 to a second voltage to serve as the second amplifying signal VST1P. Moreover, a difference value between the first amplifying signal VST1N and the second amplifying signal VST1P is greater than a difference value between the voltage signal Vin to be compared and the reference voltage signal Vref, so as to implement a first amplification of the input differential signal.

The second stage circuit 200 is connected with the first stage circuit 100 and is configured to generate and latch a first output signal V0+ and a second output signal V0− based on the first amplifying signal VST1N and the second amplifying signal VST1P. The second stage circuit 200 is configured to receive the first amplifying signal VST1N and the second amplifying signal VST1P, and further differentially amplify the first amplifying signal VST1N and the second amplifying signal VST1P to generate the first output signal V0+ and the second output signal V0−. The second stage circuit 200 latches the first output signal V0+ and the second output signal V0− to keep the signal at a fixed level, so as to output signals stably.

Figure 2:
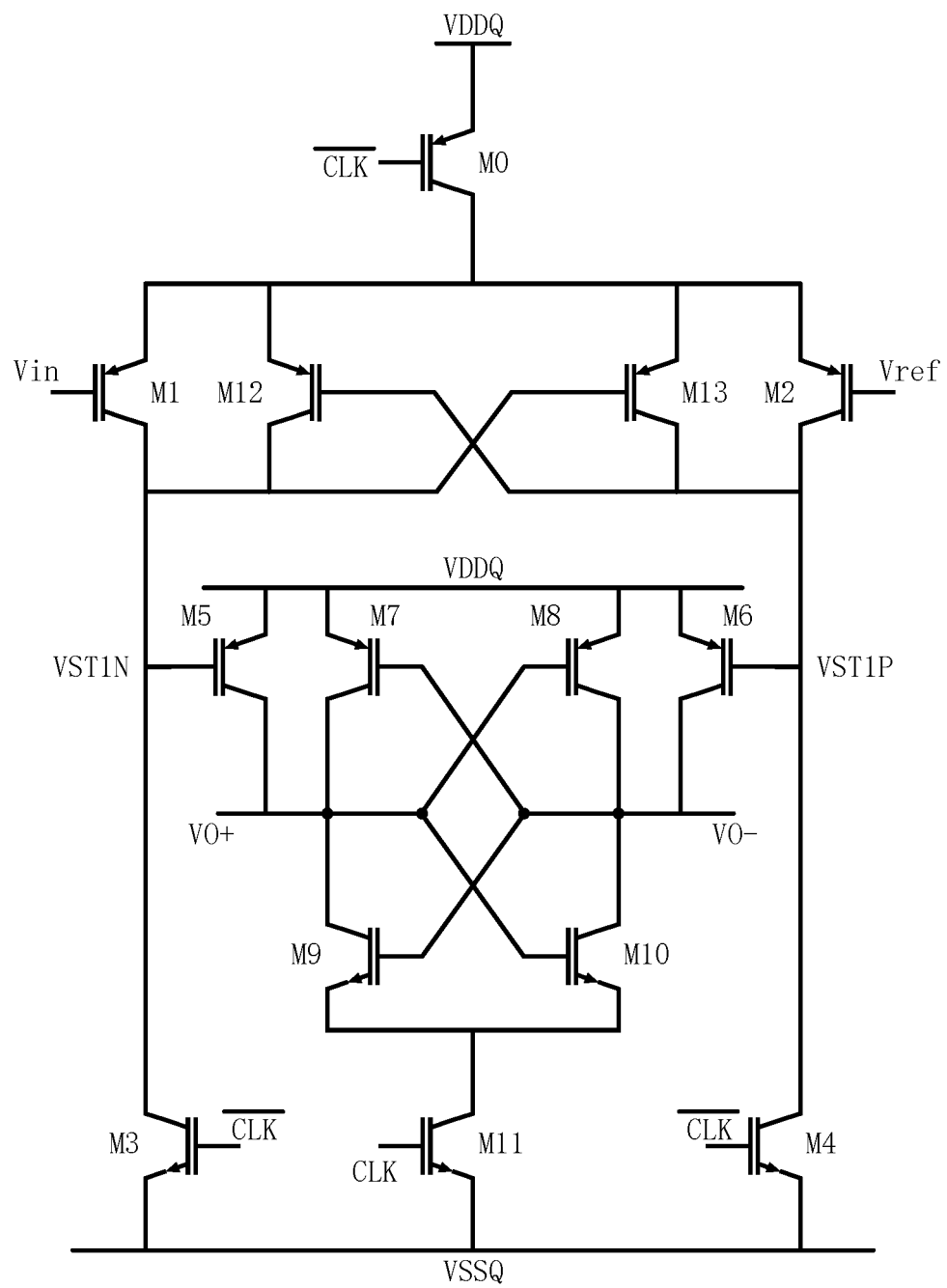
FIG. 2 is a circuit diagram of the comparator according to the embodiment.

The first stage circuit 100 and/or the second stage circuit 200 comprise(s) a first pair of cross-coupled transistors. A transistor M7 and a transistor M8 in FIG. 2 are a first pair of cross-coupled transistors, and a transistor M12 and a transistor M13 are another first pair of cross-coupled transistors. Specifically, the pair of transistors refers to two transistors with the same structure and electrical characteristics, and in this embodiment, the two same transistors may be fabricated on the same substrate, so that a change in parameters, such as an ambient temperature, or the like, exerts the same influence on the performance of the two transistors. That is, the two transistors have the same performance parameters, such as a noise coefficient, a characteristic curve, an amplification factor, or the like. Therefore, a specific connection may cancel out the influence of noise and temperature of the transistor on its characteristics to a great extent, thereby preventing the influence of a common-mode signal on a differential-mode signal, namely, the influence on a differential-mode output signal, so as to reduce noise in the output signal, and to output signals stably and accurately.

It is understood that the transistors M1 and M2 have sufficient transconductance in the case of a relatively low common-mode level, and thus, the first and second amplifying signals VST1N and VST1P may be charged to a target voltage more quickly. However, in the case of the high input common-mode level, a charging current for charging the first and second amplifying signals VST1N and VST1P is reduced, resulting in a reduction in charging speed and thus an increase in onset time of the first and second amplifying signals VST1N and VST1P. In this embodiment, the first pair of cross-coupled transistors can be turned on during the onset of the first amplifying signal VST1N and the second amplifying signal VST1P, and an additional differential charging current can be provided through positive feedback, so as to accelerate the charging speed of the first amplifying signal VST1N and the second amplifying signal VST1P, and reduce the current consumption, thereby implementing a comparator 10 with less regeneration delay and lower power consumption.

In this embodiment, the first stage circuit 100 and the second stage circuit 200 jointly amplify the difference value between the input voltage signal Vin to be compared and the reference voltage signal Vref. The amplification and latch of signals by a two-stage circuit reduce the number of transistors, and other elements required in each stage circuit, thereby implementing the differential comparison function with a lower power voltage, and further reducing demands of the comparator 10 for the power voltage and decreasing the power consumption, so that the comparator 10 according to this embodiment is more suitable for a memory with a relatively low power voltage and lower power consumption, for example LPDDR4 (Low Power Double Data Rate 4), LPDDR4X, LPDDR5, or the like.

FIG. 2 is a circuit diagram of the comparator according to the embodiment. Referring to FIG. 2, in this embodiment, both the first stage circuit 100 and the second stage circuit 200 include a pair of input transistors. The pair of input transistors of the first stage circuit 100 includes the transistor M1 and the transistor M2, and the pair of input transistors of the first stage circuit 100 is configured to receive the voltage signal Vin to be compared and the reference voltage signal Vref. The pair of input transistors of the second stage circuit 200 includes the transistor M5 and the transistor M6, and the pair of input transistors of the second stage circuit 200 is configured to receive the first amplifying signal VST1N and the second amplifying signal VST1P. The pair of input transistors of the first stage circuit 100 is of the same type as the pair of input transistors of the second stage circuit 200.

Specifically, the type of the pair of input transistors includes P type and N type. The pair of input transistors of the first stage circuit 100 and the pair of input transistors of the second stage circuit 200 may all be of P type. It can be understood that the P-type transistor is turned on when Vgs is less than a preset value. Therefore, the P-type transistor is more suitable for usage scenarios where the voltage signal Vin to be compared and the reference voltage signal Vref have lower amplitudes, for example, a voltage amplitude of 100 mV to 150 mV. The pair of input transistors of the first stage circuit 100 and the pair of input transistors of the second stage circuit 200 may also be of N type. The N-type transistor is turned on when Vgs is greater than a preset value. Therefore, the N-type transistor is more suitable for usage scenarios where the voltage amplitude is relatively high. That is, the N-type transistor or the P-type transistor can be used as the pair of input transistors according to the voltage amplitude ranges of the voltage signal Vin to be compared and the reference voltage signal Vref, so as to obtain more accurate differential comparison results.

In one embodiment, each of the first stage circuit 100 and the second stage circuit 200 includes a clock-controlled switch. In FIG. 2, the transistor M0, the transistor M3, the transistor M4, and the transistor M11 are all clock-controlled switches which can control ON and OFF of the circuit, so as to enable the comparator 10 to realize different functions, i.e., a reset function or an amplification latch function. Under the coordination of a clock signal and the ON characteristic of the clock-controlled switch, the transistor M3 and the transistor M4 are turned on simultaneously, and the transistor M0 and the transistor M11 turned on simultaneously. Moreover, the transistor M0 and the transistor M11 is turned off when the transistor M3 and the transistor M4 are turned on simultaneously.

Figure 3:
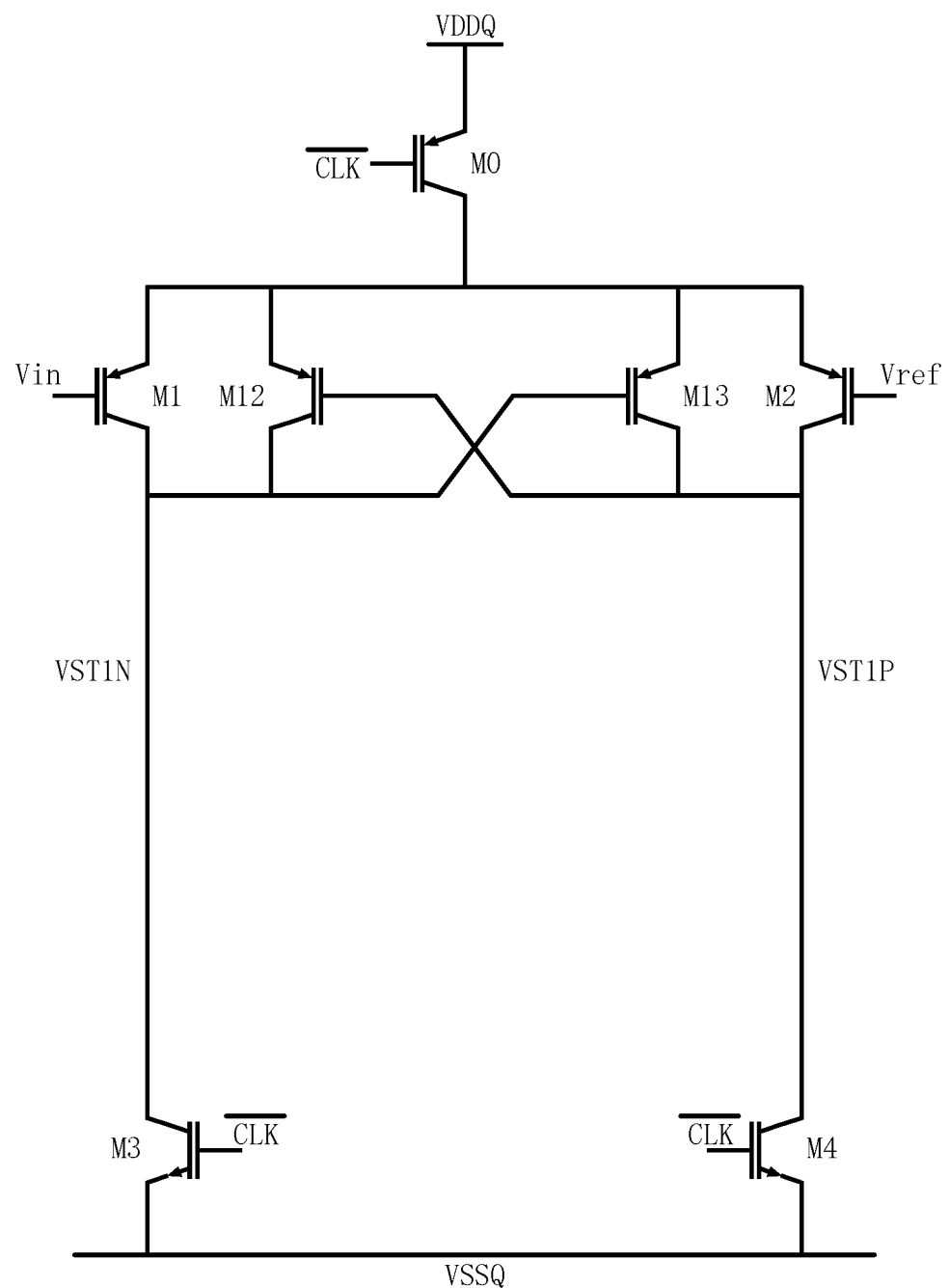
FIG. 3 is a first stage circuit diagram in the embodiment of FIG. 2.
Figure 4:
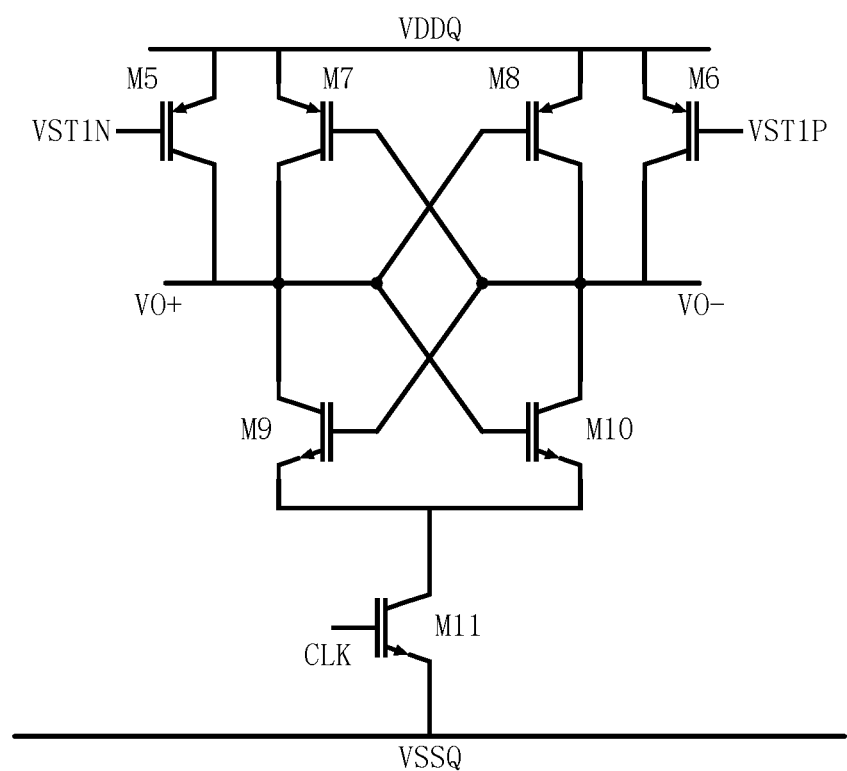
FIG. 4 is a second stage circuit diagram in the embodiment of FIG. 2.

Specifically, FIG. 3 is a first stage circuit diagram in the embodiment of FIG. 2, and FIG. 4 is a second stage circuit diagram in the embodiment of FIG. 2.

Referring to FIG. 3, when the transistor M0 is turned on and the transistors M3 and M4 are turned off, the pair of input transistors in the first stage circuit 100 receive input signals, and since the gates of the transistors in the pair of input transistors receive different voltage signals, the charging current of the transistor M1 is different from the charging current of the transistor M2. Therefore, the voltage values of the first amplifying signal VST1N and the second amplifying signal VST1P at the same time are also different; that is, a differential amplification of the two input signals by the first stage circuit 100 is achieved to generate the first amplifying signal VST1N and the second amplifying signal VST1P, and output the first amplifying signal VST1N and the second amplifying signal VST1P to the second stage circuit 200.

Referring to FIG. 4, when the transistor M11 is turned on, the pair of input transistors in the second stage circuit 200 receives the first amplifying signal VST1N and the second amplifying signal VST1P, and the pair of input transistors in the second stage circuit 200 amplifies the first amplifying signal VST1N and the second amplifying signal VST1P based on the same amplification principle as that of the first stage circuit 100 to generate the first output signal V0+ and the second output signal V0−. Then, the latch structure of the second stage circuit 200 latches the first output signal V0+ and the second output signal V0−, thereby achieving accurate and stable output. It should be noted that the latch structure is not limited to the one consisting of four transistors shown in the drawing, and other structures having a latch function also fall within the protection scope of the present application.

Referring to FIG. 3, when the transistor M0 is turned off and the transistors M3 and M4 are turned on, both output terminals of the first stage circuit 100 are connected to a low voltage source through the transistors. That is, the output terminal of the first amplifying signal VST1N is connected to the low voltage source through the transistor M3, and the output terminal of the second amplifying signal VST1P is connected to the low voltage source through the transistor M4. Therefore, the voltage signal Vin to be compared and the reference voltage signal Vref do not change the first amplifying signal VST1N and the second amplifying signal VST1P, and the voltages of the first amplifying signal VST1N and the second amplifying signal VST1P are kept lower than the voltage of the low voltage source. Correspondingly, referring to FIG. 4, the two output signals of the second stage circuit 200 will not change due to no change in the input signal of the second stage circuit 200. Further, the first output terminal of the second stage circuit 200 is connected to a high voltage source through the transistor M5, the second output terminal of the second stage circuit 200 is connected to the high voltage source through the transistor M6, and when the transistor M5 and the transistor M6 are turned on, the voltages of the two output terminals are both pulled up to the voltage of the high voltage source, so that the reset of the comparator 10 is realized.

In one of the embodiments, the first stage circuit 100 and the second stage circuit 200 have a same number of transistors on the respective current paths. The first stage circuit 100 is connected to the high voltage source and the low voltage source, the second stage circuit 200 is also connected to the high voltage source and the low voltage source. The current path refers to a signal pathway between the high voltage source and the low voltage source, the comparator 10 includes a plurality of current paths with transistors, and the two transistors in the pair of transistors belong to different current paths.

Referring to FIG. 2 continuously, the comparator 10 includes a plurality of current paths. For example, the transistor M0, transistor M1, and transistor M3 collectively form a current path, and the transistor M7, transistor M9, and transistor M11 collectively form a current path. As such, in the present embodiment, each current path includes three transistors. In the prior art, at least one transistor is required as the clock-controlled switch, at least one pair of transistors is required as the pair of input transistors, and a plurality of transistors are configured to amplify and latch signals, that is, each current path in the prior art including at least four transistors. It can be understood that a power level is shared by the plurality of transistors on the same current path. Therefore, the more transistors on the current path, the less the Vgs obtained by each transistor, which degenerates the transconductance of the transistor and slows down the charging and discharging speed. Consequently, in the present embodiment, the number of transistors on each current path is reduced by dividing the comparator 10 into the first stage circuit 100 and the second stage circuit 200, thereby increasing the Vgs of each transistor and effectively preventing the regeneration delay.

In one of the embodiments, referring to FIG. 2, the pair of input transistors of the first stage circuit 100 is of the same type as the first pair of cross-coupled transistors, i.e., the transistors M1, M2, M12, and M13 in FIG. 2 are of the same type. For example, the pair of input transistors and the first pair of cross-coupled transistors of the first stage circuit 100 may all be N-type transistors, or the pair of input transistors and the first pair of cross-coupled transistors of the first stage circuit 100 may also be P-type transistors. The type of transistor may be selected appropriately based on the voltage amplitude of the input signal.

Further, the pair of input transistors of the first stage circuit 100 is arranged in parallel on the current path with the first pair of cross-coupled transistors of the first stage circuit 100. The pair of input transistors of the first stage circuit 100 being arranged in parallel with the first pair of cross-coupled transistors of the first stage circuit 100 refers to such an arrangement that the sources of the two transistors in the pair of input transistors of the first stage circuit 100 are connected with the sources of the two transistors in the first pair of cross-coupled transistors of the first stage circuit 100, the drain of one transistor in the pair of input transistors of the first stage circuit 100 is connected with the drain of one transistor in the first pair of cross-coupled transistors of the first stage circuit 100, and the drain of the other transistor in the pair of input transistors of the first stage circuit 100 is connected with the drain of the other transistor in the first pair of cross-coupled transistors of the first stage circuit 100, but each transistor has its own gate and inputs a different control signal.

Specifically, in FIG. 2, the sources of the transistor M1, the transistor M2, the transistor M12 and the transistor M13 are connected with one another and commonly connected to the drain of the transistor M0, the transistor M1 is connected with the transistor M12 for jointly outputting the first amplifying signal VST1N, the transistor M2 is connected with the transistor M13 for jointly outputting the second amplifying signal VST1P, the gate of the transistor M1 is configured to connect the voltage signal Vin to be compared, the gate of the transistor M2 is configured to connect the reference voltage signal Vref, the gate of the transistor M12 is configured to connect the second amplifying signal VST1P, and the gate of the transistor M13 is configured to connect the first amplifying signal VST1N. It should be noted that, in other embodiments, the parallel connection of the pairs of transistors on the current path is similar to that of the present embodiment, and will not be described again.

In one of the embodiments, the pair of input transistors of the second stage circuit 200 is of the same type as the first pair of cross-coupled transistors, i.e., the transistors M5, M6, M7, and M8 in FIG. 2 are of the same type. For example, the pair of input transistors and the first pair of cross-coupled transistors of the second stage circuit 200 may all be N-type transistors, or the pair of input transistors and the first pair of cross-coupled transistors of the second stage circuit 200 may also be P-type transistors. The type of transistor may be selected appropriately based on the voltage amplitude of the input signal. Further, the pair of input transistors of the second stage circuit 200 are connected in parallel on their current paths with the first pair of cross-coupled transistors of the second stage circuit 200.

In one of the embodiments, the second stage circuit 200 further includes a second pair of cross-coupled transistors. The second pair of cross-coupled transistors includes the transistor M9 and the transistor M10 in FIG. 2. Further, the first pair of cross-coupled transistors and the second pair of cross-coupled transistors in the second stage circuit 200 form a latch to latch the first output signal VO+ and the second output signal V0−, so as to achieve accurate and stable output of the signals.

Referring to FIG. 2 continuously, in one of the embodiments, the first stage circuit 100 includes the transistors M0, M1, M2, M3, and M4. The transistors M0, M1, M2 and M3 are all of P type, the transistor M3 and the transistor M4 are of N type, the transistor M0, the transistor M3 and the transistor M4 are clock-controlled switches, and the transistor M1 and the transistor M2 are a pair of input transistors.

The source of the transistor M0 is connected to the high voltage source, and the gate of the transistor M0 is connected to the clock signal. The source of the transistor M1 is connected to the drain of the transistor M0, the drain of the transistor M1 is connected to the second stage circuit 200 to transmit the first amplifying signal VST1N to the second stage circuit 200, and the gate of the transistor M1 is connected to the voltage signal Vin to be compared. The source of the transistor M2 is connected to the drain of the transistor M0, the drain of the transistor M2 is connected to the second stage circuit 200 to transmit the second amplifying signal VST1P to the second stage circuit 200, and the gate of the transistor M2 is connected to the reference voltage signal Vref. The source of the transistor M3 is connected to the low voltage source, the drain of the transistor M3 is connected to the drain of the transistor M1, and the gate of the transistor M3 is connected to the clock signal. The source of the transistor M4 is connected to the low voltage source, the drain of the transistor M4 is connected to the drain of the transistor M2, and the gate of the transistor M4 is connected to the clock signal.

Further, the first stage circuit 100 further includes the transistor M12 and the transistor M13. The transistor M12 and the transistor M13 are both of P type, as the first pair of cross-coupled transistors. The source of the transistor M12 is connected to the drain of the transistor M0, the drain of the transistor M12 is connected to the drain of the transistor M1, and the gate of the transistor M12 is connected to the drain of the transistor M2. The source of transistor M13 is connected to the drain of the transistor M0, the drain of the transistor M13 is connected to the drain of the transistor M2, and the gate of the transistor M13 is connected to the drain of the transistor M1.

Still further, the second stage circuit 200 includes the transistors M5, M6, M7, M8, M9, and M10. The transistor M5, the transistor M6, the transistor M7, and the transistor M8 are all of P type, and the transistor M9 and the transistor M10 are both of N type.

The source of the transistor M5 is connected to the high voltage source, the gate of the transistor M5 is connected to the drain of the transistor M1, and the drain of the transistor M5 is configured to output the first output signal V0+. The source of the transistor M6 is connected to the high voltage source, the gate of the transistor M6 is connected to the drain of the transistor M2, and the drain of the transistor M6 is configured to output the second output signal V0−. The source of the transistor M7 is connected to the high voltage source, the drain of the transistor M7 is connected to the drain of the transistor M5, and the gate of the transistor M7 is connected to the drain of the transistor M6. The source of the transistor M8 is connected to the high voltage source, the drain of the transistor M8 is connected to the drain of the transistor M6, and the gate of the transistor M8 is connected to the drain of the transistor M5. The drain of the transistor M9 is connected to the drain of the transistor M5, and the gate of the transistor M9 is connected to the drain of the transistor M6. The drain of the transistor M10 is connected to the drain of the transistor M6, and the gate of the transistor M10 is connected to the drain of the transistor M5. The source of the transistor M11 is connected to the low voltage source, the drain of the transistor M11 is connected to the source of the transistor M9 and the source of the transistor M10, and the gate of the transistor M11 is connected to the clock signal.

Figure 5:
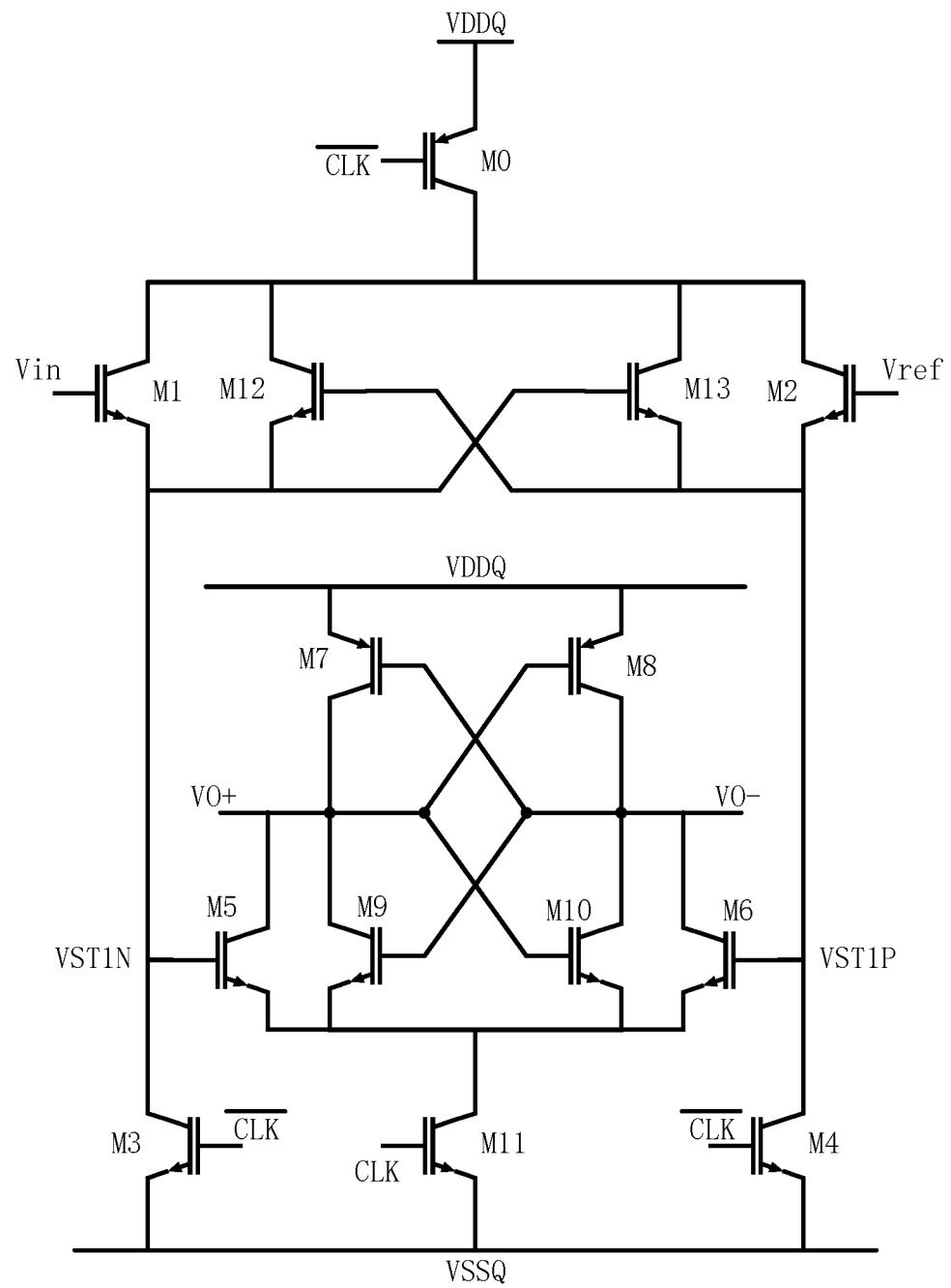
FIG. 5 is a circuit diagram of a comparator according to another embodiment.

FIG. 5 is a circuit diagram of a comparator 10 according to another embodiment. Referring to FIG. 5, in this embodiment, the transistor M1 and the transistor M2 are N-type transistors, and the second stage circuit 200 includes the transistors M5, M6, M7, M8, M9, and M10. The transistor M5, the transistor M6, the transistor M9 and the transistor M10 are all N-type transistors, and the transistor M7 and the transistor M8 are both P-type transistors.

The gate of the transistor M5 is connected to the drain of the transistor M1, and the drain of the transistor M5 is configured to output the first output signal V0+. The gate of the transistor M6 is connected to the drain of the transistor M2, and the drain of the transistor M6 is configured to output the second output signal VO−. The source of the transistor M7 is connected to the high voltage source, the drain of the transistor M7 is connected to the drain of the transistor M5, and the gate of the transistor M7 is connected to the drain of the transistor M6. The source of the transistor M8 is connected to the high voltage source, the drain of the transistor M8 is connected to the drain of the transistor M6, and the gate of the transistor M8 is connected to the drain of the transistor M5. The drain of the transistor M9 is connected to the drain of the transistor M5, and the gate of the transistor M9 is connected to the drain of the transistor M6. The drain of the transistor M10 is connected to the drain of the transistor M6, and the gate of the transistor M10 is connected to the drain of the transistor M5. The source of the transistor M11 is connected to the low voltage source, the drain of the transistor M11 is connected to the source of the transistor M5, the source of the transistor M6, the source of the transistor M9 and the source of the transistor M10, and the gate of the transistor M11 is connected to the clock signal.

Figure 6:
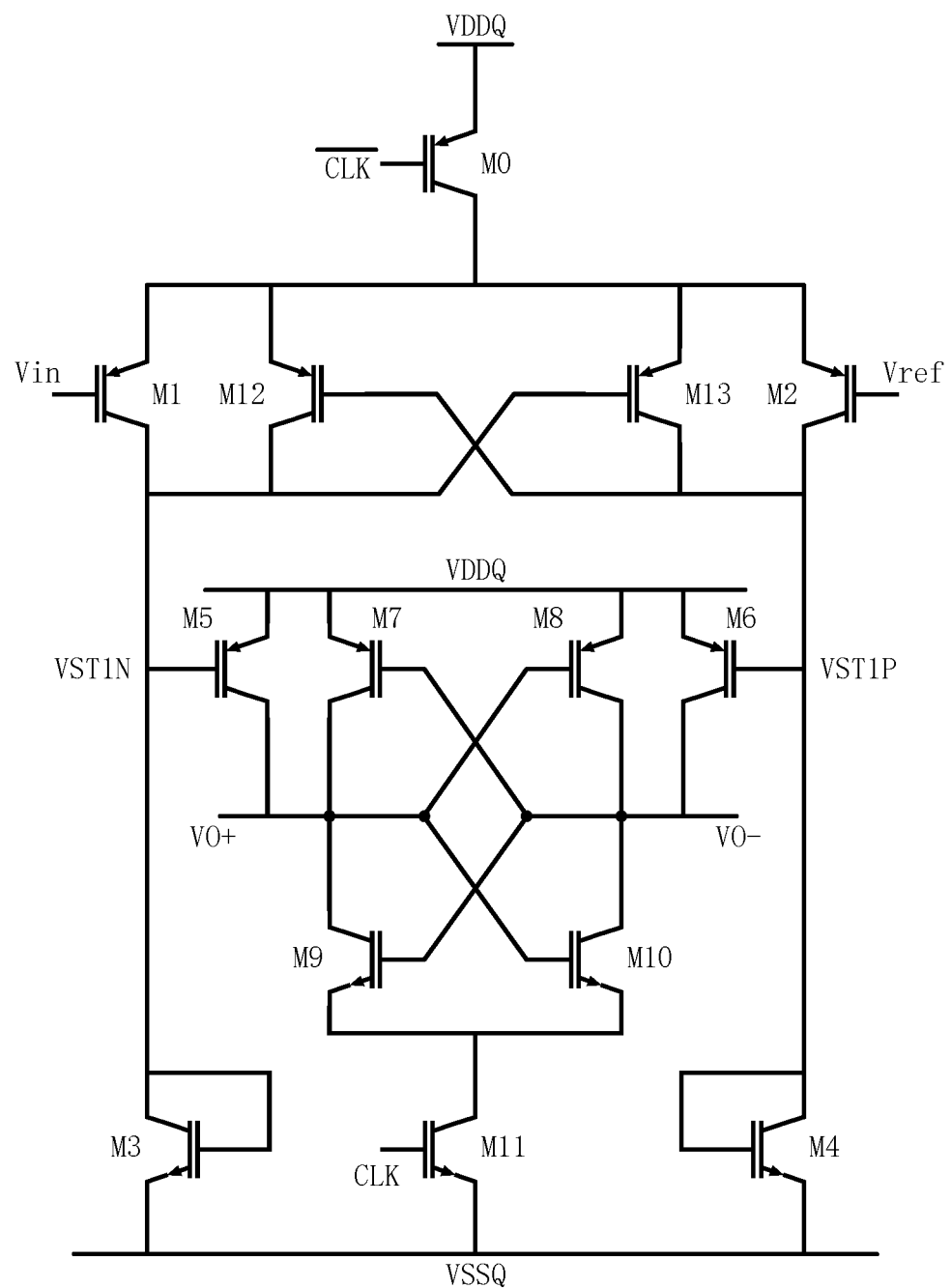
FIG. 6 is a circuit diagram of a comparator according to yet another embodiment.

FIG. 6 is a circuit diagram of a comparator 10 according to yet another embodiment. Referring to FIG. 6, in the present embodiment, the connection between the transistors M0 to M2 and between the transistors M5 and M13 is the same as that of the comparator 10 shown in the embodiment of FIG. 2, and the description thereof is omitted. In this embodiment, the gate and drain of the transistor M3 are connected with each other and commonly connected to the drain of transistor M1, the source of the transistor M3 is connected to the low voltage source, the gate and drain of the transistor M4 are connected with each other and commonly connected to the drain of the transistor M2, and the source of transistor M4 is connected to the low voltage source.

Figure 7:
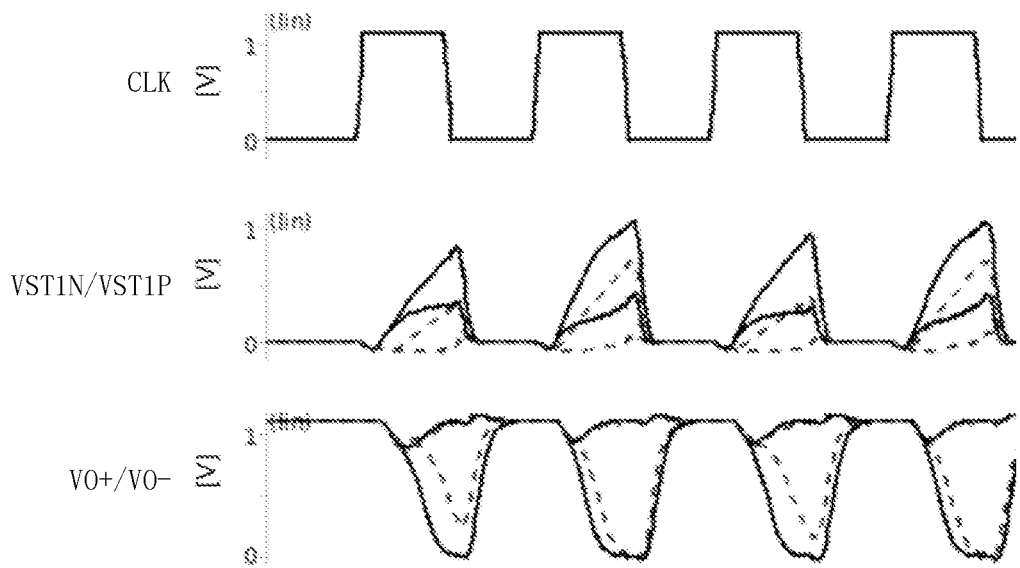
FIG. 7 shows test simulation results of the comparator according to the embodiment of FIG. 2.

FIG. 7 shows test simulation results of the comparator 10 according to the embodiment of FIG. 2, the simulation results shown in FIG. 7 adopting a data rate of 4266 Mbps. In FIG. 7, the solid line indicates the simulation result of the comparator 10 according to the embodiment of the present application, and the dotted line indicates the simulation result of the comparator 10 in the prior art. Referring to FIG. 7, after a rising edge of the clock signal, the first amplifying signal VST1N and the second amplifying signal VST1P output by the first stage are both improved significantly, and accordingly, an earlier and more effective input signal is provided for the second stage circuit 200, thereby enhancing the output effects of the first output signal VO+ and the second output signal VO−, obtaining a better differential amplification, and effectively preventing the regeneration delay.

Figure 8:
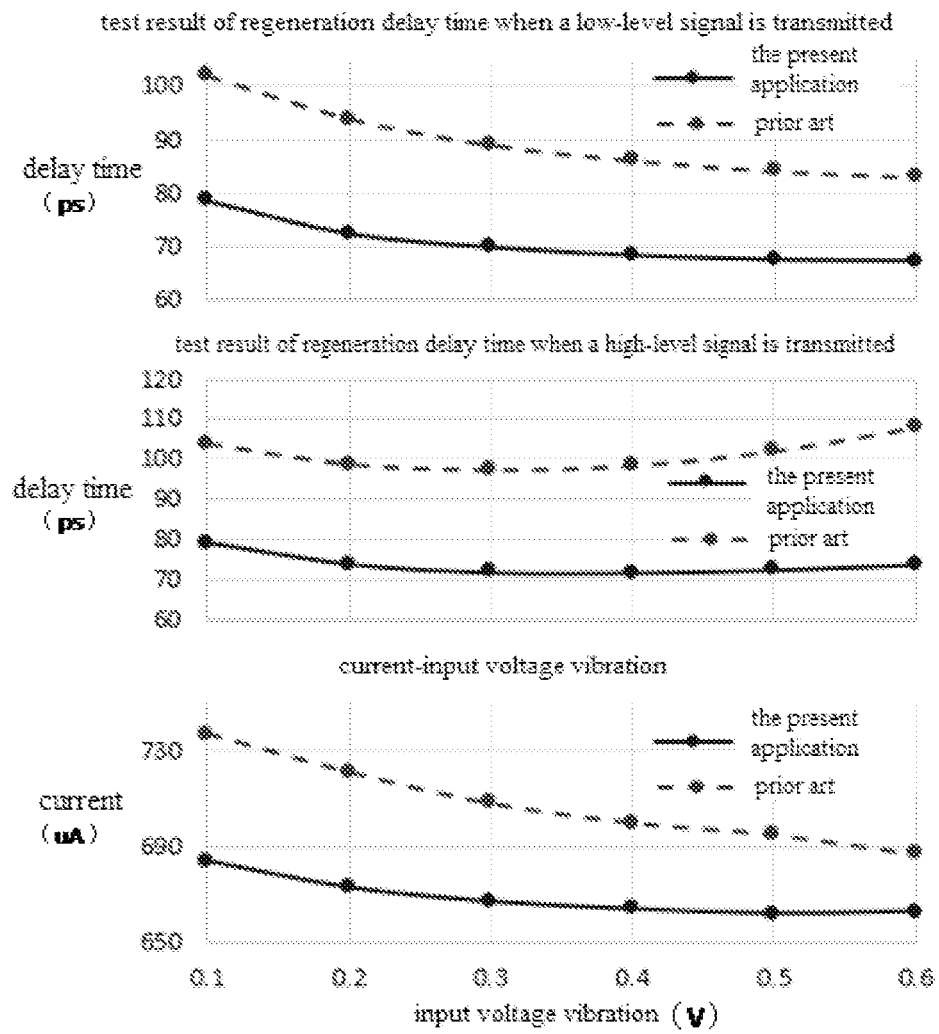
FIG. 8 shows test results of regeneration delay time and current consumption of the comparator according to the embodiment of FIG. 2.

FIG. 8 shows test results of regeneration delay time and current consumption of the comparator 10 according to the embodiment of FIG. 2. In FIG. 8, the solid line indicates the test results of the comparator 10 according to the embodiment of the present application, and the dotted line indicates the test results of the comparator 10 in the prior art. Referring to FIG. 8, with the comparator 10 according to the embodiment of FIG. 2, compared to the prior art, in the case of transmitting a high-level signal, the regeneration delay time is shortened by 21%; in the case of transmitting a low-level signal, the regeneration delay time is shortened by 27%. Meanwhile, compared with the prior art, the current consumption is effectively reduced by at least 5%, and therefore, the comparator 10 according to the embodiment of the present application can increase the comparison speed and suppress the power loss effectively.

Technical features of the above embodiments may be combined randomly. To make descriptions brief, not all possible combinations of the technical features in the embodiments are described. Therefore, as long as there is no contradiction between the combinations of the technical features, they should all be considered as scopes disclosed in the specification.

The above embodiments only describe several implementations of the present disclosure, and their description is specific and detailed, but cannot therefore be understood as a limitation on the patent scope of the present disclosure. It should be noted that those of ordinary skill in the art may further make variations and improvements without departing from the conception of the present disclosure, and these all fall within the protection scope of the present disclosure. Therefore, the patent protection scope of the present disclosure should be subject to the appended claims.

What is claimed is:

1. A comparator, comprising:
    a first stage circuit, configured to receive a voltage signal to be compared and a reference voltage signal, and to generate and output a first amplifying signal and a second amplifying signal based on the voltage signal to be compared and the reference voltage signal;
    a second stage circuit, connected with the first stage circuit, configured to generate and latch a first output signal and a second output signal based on the first amplifying signal and the second amplifying signal;
    wherein at least one of the first stage circuit and the second stage circuit comprises a first pair of cross-coupled transistors;
    wherein the first stage circuit comprises:
    a transistor M0, having a source connected with a high voltage source and a gate connected with a clock signal;
    a transistor M1, having a source connected with a drain of the transistor M0, a drain connected with the second stage circuit to transmit the first amplifying signal to the second stage circuit, and a gate connected with the voltage signal to be compared;
    a transistor M2, having a source connected with the drain of the transistor M0, a drain connected with the second stage circuit to transmit the second amplifying signal to the second stage circuit, and a gate connected with the reference voltage signal;
    a transistor M3, having a source connected with a low voltage source, a gate and a drain of the transistor M3 are connected with each other and commonly connected to the drain of transistor M1;
    a transistor M4, having a source connected with the low voltage source, a gate and a drain of the transistor M4 are connected with each other and commonly connected to the drain of the transistor M2;
    a transistor M12, having a source connected with the drain of the transistor M0, a drain connected with the drain of the transistor M1, and a gate connected with the drain of the transistor M2; and
    a transistor M13, having a source connected with the drain of the transistor M0, a drain connected with the drain of the transistor M2, and a gate connected with the drain of the transistor M1.

2. The comparator according to claim 1, wherein each of the first stage circuit and the second stage circuit comprises a clock-controlled switch.

3. The comparator according to claim 1, wherein the first stage circuit and the second stage circuit have a same number of transistors on respective current paths.

4. The comparator according to claim 1, wherein each of the first stage circuit and the second stage circuit comprises a pair of input transistors, the pair of input transistors of the first stage circuit being configured to receive the voltage signal to be compared and the reference voltage signal, the pair of input transistors of the second stage circuit being configured to receive the first amplifying signal and the second amplifying signal;
    wherein the pair of input transistors of the first stage circuit is of the same type as the pair of input transistors of the second stage circuit.

5. The comparator according to claim 4, wherein the first stage circuit comprises the first pair of cross-coupled transistors, the pair of input transistors of the first stage circuit being of the same type as the first pair of cross-coupled transistors of the first stage circuit.

6. The comparator according to claim 4, wherein the second stage circuit comprises the first pair of cross-coupled transistors, the pair of input transistors of the second stage circuit being of the same type as the first pair of cross-coupled transistors of the second stage circuit.

7. The comparator according to claim 4, wherein the first stage circuit comprises the first pair of cross-coupled transistors, the pair of input transistors of the first stage circuit being connected in parallel with the first pair of cross-coupled transistors of the first stage circuit on a current path.

8. The comparator according to claim 4, wherein the second stage circuit comprises the first pair of cross-coupled transistors, the pair of input transistors of the second stage circuit being connected in parallel with the first pair of cross-coupled transistors of the second stage circuit on its current path.

9. The comparator according to claim 1, wherein the second stage circuit further comprises a second pair of cross-coupled transistors.

10. The comparator according to claim 9, wherein the second stage circuit comprises the first pair of cross-coupled transistors, the first pair of cross-coupled transistors and the second pair of cross-coupled transistors of the second stage circuit constituting a latch for latching the first output signal and the second output signal.

11. The comparator according to claim 1, wherein the second stage circuit comprises:

a transistor M5, having a source connected with a high voltage source, a gate connected with the drain of the transistor M1, and a drain configured to output the first output signal;

a transistor M6, having a source connected with the high voltage source, a gate connected with the drain of the transistor M2, and a drain configured to output the second output signal;

a transistor M7, having a source connected with the high voltage source, a drain connected with the drain of the transistor M5, and a gate connected with the drain of the transistor M6;

a transistor M8, having a source connected with the high voltage source, a drain connected with the drain of the transistor M6, and a gate connected with the drain of the transistor M5;

a transistor M9, having a drain connected with the drain of the transistor M5, and a gate connected with the drain of the transistor M6;

a transistor M10, having a drain connected with the drain of the transistor M6, and a gate connected with the drain of the transistor M5;

a transistor M11, having a source connected with the low voltage source, a drain connected with the source of the transistor M9 and the source of the transistor M10, and a gate connected with the clock signal.

12. The comparator according to claim 11, wherein both the transistor M5 and the transistor M6 are of N type.

13. The comparator according to claim 1, wherein the second stage circuit comprises:

a transistor M5, having a gate connected with the drain of the transistor M1, and a drain configured to output the first output signal;

a transistor M6, having a gate connected with the drain of the transistor M2, and a drain configured to output the second output signal;

a transistor M7, having a source connected with the high voltage source, a drain connected with the drain of the transistor M5, and a gate connected with the drain of the transistor M6;

a transistor M8, having a source connected with the high voltage source, a drain connected with the drain of the transistor M6, and a gate connected with the drain of the transistor M5;

a transistor M9, having a drain connected with the drain of the transistor M5, and a gate connected with the drain of the transistor M6;

a transistor M10, having a drain connected with the drain of the transistor M6, and a gate connected with the drain of the transistor M5;

a transistor M11, having a source connected with the low voltage source, a drain connected with the source of the transistor M5, the source of the transistor M6, the source of the transistor M9 and the source of the transistor M10, and a gate connected with the clock signal.

14. The comparator according to claim 13, wherein both the transistor M5 and the transistor M6 are of P type.

* * * * *